(12) United States Patent
Preikszas et al.

(10) Patent No.: US 7,523,009 B2
(45) Date of Patent: Apr. 21, 2009

(54) CONTROL OF INSTRUMENTS

(75) Inventors: Dirk Preikszas, Okerkochen (DE);
David Ralph Hubbard, Cambridge (GB)

(73) Assignee: Carl Zeiss NTS GmbH, Oberkochen (DE)

( * ) Notice: Subject to any disclaimer, the term of this patent is extended or adjusted under 35 U.S.C. 154(b) by 0 days.

(21) Appl. No.: 10/639,925

(22) Filed: Aug. 12, 2003

(65) Prior Publication Data
US 2004/0064283 A1 Apr. 1, 2004

(30) Foreign Application Priority Data
Sep. 26, 2002 (GB) ................... 0222328.7

(51) Int. Cl.
*G06F 19/00* (2006.01)
*G01N 23/00* (2006.01)
(52) U.S. Cl. ..................... 702/107; 250/311
(58) Field of Classification Search ............... 702/107, 702/85; 250/396 R, 201.3, 311; 359/383, 359/17; 349/17; 382/255
See application file for complete search history.

(56) References Cited
U.S. PATENT DOCUMENTS

| 4,068,123 | A | * | 1/1978 | Kokubo ................ 250/311 |
| 4,675,528 | A | * | 6/1987 | Langner et al. ......... 250/396 R |
| 4,871,912 | A | * | 10/1989 | Kokubo et al. .......... 250/311 |
| 4,999,496 | A | * | 3/1991 | Shaw et al. ............. 250/310 |
| 5,013,913 | A | | 5/1991 | Benner |
| 5,359,197 | A | * | 10/1994 | Komatsu et al. ........ 250/310 |
| 5,481,111 | A | * | 1/1996 | Rosar et al. ............. 250/311 |
| 5,483,073 | A | | 1/1996 | Benner |
| 5,519,216 | A | * | 5/1996 | Benner et al. ........... 250/311 |
| 5,633,491 | A | * | 5/1997 | Kasdan .................. 250/201.3 |
| 5,650,621 | A | * | 7/1997 | Tsuneta et al. .......... 250/311 |
| 5,825,670 | A | * | 10/1998 | Chernoff et al. ........ 702/85 |

(Continued)

FOREIGN PATENT DOCUMENTS

EP 1128413 A1 8/2001

(Continued)

OTHER PUBLICATIONS

Schneider et al., Development and Application of a Computer Control System for an Analytical Electron Microscope, 1990, IOP Publishing Ltd, Meas. Sci. Technol. 1, pp. 887-893.*

(Continued)

*Primary Examiner*—Michael P. Nghiem
*Assistant Examiner*—Toan M Le
(74) *Attorney, Agent, or Firm*—Barnes & Thornburg LLP (57) ABSTRACT

An instrument, in particular an electron microscope, has at least one user controllable operating parameter and at least one further operating parameter having a required value at least partially dependent on that of the user controllable parameter. A number of possible values of the further operating parameter are stored in a memory and each stored value corresponds to a respective possible value of the user controllable parameter. Selecting one of said stored possible values causes the instrument to be controlled accordingly. There is also provided a tuner for enabling the user to alter the selected value and updating apparatus for updating the memory accordingly, so that the adjusted value of the further operating parameter is subsequently selected from the memory if the same value of the user controllable parameter is then chosen again.

34 Claims, 3 Drawing Sheets

U.S. PATENT DOCUMENTS

| | | | |
|---|---|---|---|
| 5,831,265 A * | 11/1998 | Shinkawa | 250/310 |
| 5,886,816 A * | 3/1999 | Faris | 359/464 |
| 5,965,894 A * | 10/1999 | Krijn et al. | 250/396 R |
| 6,040,576 A | 3/2000 | Benner | |
| 6,184,524 B1 * | 2/2001 | Brink et al. | 250/305 |
| 6,246,058 B1 * | 6/2001 | Tiemeijer | 250/396 R |
| 6,335,532 B1 * | 1/2002 | Tanaka et al. | 250/491.1 |
| 6,472,663 B2 * | 10/2002 | Nagaoki et al. | 250/311 |
| 6,512,632 B2 * | 1/2003 | Yamamoto | 359/383 |
| 6,630,668 B1 * | 10/2003 | Cramer et al. | 250/310 |
| 6,661,008 B2 * | 12/2003 | Takagi et al. | 250/310 |
| 6,674,574 B1 * | 1/2004 | Aono | 359/383 |
| 6,760,154 B1 * | 7/2004 | Focht | 359/383 |
| 6,765,217 B1 * | 7/2004 | Nishimura et al. | 250/491.1 |
| 6,825,480 B1 * | 11/2004 | Watanabe et al. | 250/491.1 |
| 6,841,775 B2 * | 1/2005 | Kondo et al. | 250/306 |

FOREIGN PATENT DOCUMENTS

JP          2002141014 A          10/2001

OTHER PUBLICATIONS

Caldwell et al., XperEze: A Knowledge-Based Approach to Scanning Electron Microscopy, 1997, In: Applications and Innovations in Expert Systems V. SGES Publication, pp. 127-140.*

Ruan et al., Integrated Windows-Based Control System for an Electron Microscope, Dec. 1994, Rev. Sci. Instrum., vol. 65, No. 12, pp. 3682-3688.*

Tromp et al., A New Low Energy Electron Microscope, 1998, Surface Review and Letters, vol. 5, No. 6, pp. 1189-1197.*

Schneider et al., Development and Application of a Computer Control System for an Analytical Electron Microscope, 1990, Meas. Sci. Tech. 1, pp. 887-893.*

* cited by examiner

CONTROL OF INSTRUMENTS

FIELD OF THE INVENTION

This invention relates to an instrument having a user controllable operating parameter and at least one further operating parameter which has a required value which is at least partially dependent on that of said user controllable parameter. The invention is more specifically, but not exclusively, concerned with electron microscopes.

BACKGROUND TO THE INVENTION

An electron microscope has a beam generating column in which a beam of electrons is generated, shaped and focused by means of controlled electrostatic and/or magnetic fields. This beam is then scanned across a sample to be analysed.

The electron microscope has a number of user controllable operating parameters that define the operating conditions of the microscope. Those parameters include the accelerating (EHT) voltage applied to an accelerating electrons in the column. The voltage thus being related to the kinetic energy of electrons in the beam. Certain types of microscope also have a number of apertures (of different sizes) in a diaphragm in the column and elements for directing the beam through a selected one of those apertures. This provides control over the probe current constituted by the beam. Generally, for example, high probe currents (and hence large apertures) are used for analysing xrays emitted from a sample in response to the probe current, whilst lower currents are required for high resolution work, such as secondary electron imaging.

In addition, electron microscopes can have a high current mode in which the probe current is boosted by means of a condenser lens in the column and a variable pressure mode in which the sample is maintained in a sample chamber in a gaseous atmosphere above a given threshold pressure, for example, 1 Pa. These other modes also constitute user controllable operating parameters for defining the operating conditions of the microscope.

When operating an electron microscope, it is often necessary to adjust certain further operating parameters, in particular the deflection and/or focusing elements in the electron column, to ensure correct electron optical alignment of the column under the selected operating conditions. This results in time consuming adjustments every time the operating conditions are altered.

In some cases, the column is set-up precisely under a few well defined sets of operating conditions, and the various associated further operating parameters of the column are stored as factory settings. These values can then be accessed in a table, possibly using interpolation to obtain values for the further operating parameters where the conditions do not accord to any factory setting. However, the calibration is usually fixed and cannot be adjusted by the user, so that if the electron optical properties of the instrument change over time, the instrument requires re-calibration. Furthermore, it is only possible to store the settings for a few selected sets of conditions, thus permitting significant errors when the operating conditions fall between calibrated values of individual parameters.

Some microscope allow the user to store a set of operating conditions, and associated further parameters under a specified name. These conditions and parameters can be restored to re-create a prior operating regime. Unfortunately, this approach also has several problems. Firstly, when a large number of different conditions are stored, it becomes difficult to remember the contents of each data set. Furthermore, the user has little control over the data stored in each set.

SUMMARY OF THE INVENTION

According to a first aspect of the invention, there is provided an instrument having a user controllable operating parameter and at least one further operating parameter having a required value at least partially dependent on that of said user controllable parameter, the instrument also having memory means for storing a number of possible values of the further operating parameter, each said value corresponding to a respective possible value of the user controllable parameter, selection means for selecting one of said stored possible values for the further parameter and controlling the instrument accordingly, tuning means for enabling user to alter the selected value, and updating means for updating the memory accordingly, so that the adjusted value of the further operating parameter is selected from the memory if the same value of user controllable parameter is then chosen again.

Thus the invention enables the instrument to be continuously updated or re-calibrated. This is because if, for example, a particular pre-determined value of further parameter does not produce quite the desired effect, the value can be corrected using the tuning means and the updating means can then be used to revise the content of the memory accordingly.

Preferably, the instrument is operable to enable the user to select a value of the user controllable operating parameter intermediate two of the values for which there are corresponding entries in the memory for the further parameter values, the selection means being operable to interpolate the values of the further parameters given at those entries to select a value of the further parameter corresponding to said intermediate value of the controllable parameter.

In this case, if the selected, interpolated further parameter value is adjusted, the updating means is preferably operable to update each of said two values in the memory means (and preferably only those two entries) so that said interpolation would have yielded the adjusted value in response to the selection of the same intermediate value of user controllable parameter had this occurred after said updating.

Thus, even if the adjustment of the further parameter value is made in respect of a value not specifically stored in the memory, the memory can still be updated.

Preferably, the stored values of the further parameter are arranged in the memory in an index in which the stored values are arranged in an order corresponding to progressively changing values of the associated user controlled parameter.

This facilitates the interpolation of suitable further parameter values associated with user controllable parameter values not specifically stored in the memory. For example, the index may have the values in an order corresponding to progressively increase in values of the associated user controllable parameter so that the last entry in the index is the value associated with the largest value of user controllable parameter. Alternatively, the order may correspond to progressively decreasing values of the user controllable parameter.

Preferably, the instrument is a charged particle beam instrument having beam generating means for generating charged particles and for subjecting said particles to an accelerating voltage to create a beam, and an alignment element for controlling the alignment of the beam, wherein said accelerating voltage constitutes the user controllable parameter and the further operating parameter comprises a setting for the alignment element. The alignment element may be a magnetic coil, in which case the associated further parameter is the value or relative value of current passed through the coil.

Alternatively, if the element is an electrode (for producing an electrostatic deflecting field), the value of the associated parameter is the voltage applied to the electrode.

Preferably, the further operating parameter is one of the plurality of such parameters, values for all of which are stored in the memory means.

For example, in the case of a charged particle beam instrument, there may be provided a plurality of different alignment coils, the further operating parameters therefore comprising the currents in the coils or the relative current magnitudes in the coils.

Preferably, the charged particle beam instrument is a scanning electron microscope, the beam generating means, comprising an electron gun having a cathode and an extraction electrode to which said accelerating voltage is applied, the alignment coils acting as gun alignment coils for controlling the alignment of the beam onto an electron optical axis of the microscope.

Preferably, the electron microscope includes a plurality of apertures (for example formed in single diaphragm), in the path of a beam to be generated by the beam generating means, wherein the alignment coils are operable to direct the beam through any selected one of the apertures.

In this case, the accelerating voltage comprises one of a plurality of user controllable parameters, another such parameter being constituted by the identity of the aperture through which the beam is to pass.

Preferably, each entry in said list is identified by a respective index code representative of the combination of accelerating voltage and aperture identity for which the stored value of alignment coil current or relative current at that entry applies.

Preferably, the list is part of a look-up table, in which, for each index code, there are also stored values for additional parameters applicable to the respective combination of aperture identity in accelerating voltage.

For example, the microscope may include stigmator coils for correcting the distortion of the electron beam, the current for each such coil constituting a respective additional further parameter.

The microscope may have a number of operating modes, each of which constitutes a user controllable parameter. For example, the microscope may have a high current mode, in which a condenser lens is used to boost the current in the beam and/or a variable pressure mode, in which a sample is imaged when in a gaseous atmosphere of a pressure above a given threshold.

Preferably, the index code is also representative of the state (i.e. active or inactive) of at least one the operating modes.

The invention so lies in a scanning charged particle beam instrument having a gun for generating the beam of charged particles, a plurality of apertures through any selected one of which the beam may pass, accelerating electrode means which a voltage is applied to accelerate the particles away from the gun, and alignment means for directing the beam through the selected aperture, wherein the instrument includes a memory in which are stored values for the settings of alignment means dependent on the voltage applied to the accelerating electrode and the choice of aperture.

BRIEF DESCRIPTION OF THE DRAWINGS

The invention will now be described, by way of example only, with reference to the accompanying drawings in which.

DETAILED DESCRIPTION

Figure 1:
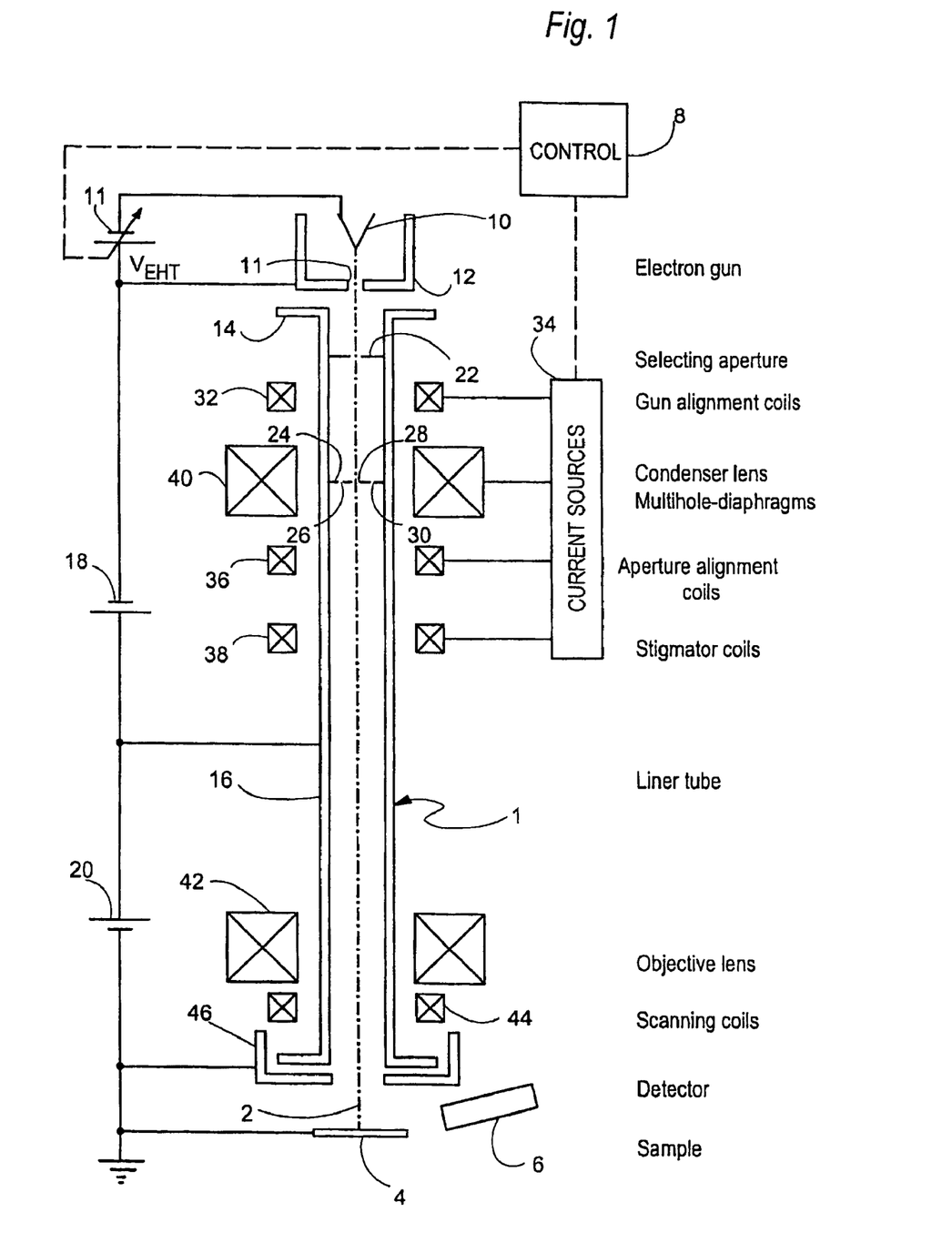
FIG. 1 is a schematic view of an electron microscope in accordance with the invention.

FIG. 1 shows an electron microscope having an electron column, generally referenced 1 for generating a beam of electrons 2 which is directed onto a sample stage 4 on which, in use, a sample to be imaged is supported. The beams scans the sample, and resultant emissions are detected by a detector 6 the output signals of which are used to construct an image. The type of detector used for the detector 6 depends upon the nature of the emissions to be detected. For example, if secondary electron emissions are to be detected, the detector 6 may be an Everhart-Thornley detector. Alternatively, the detector 6 may be an Xray detector.

Figure 2:
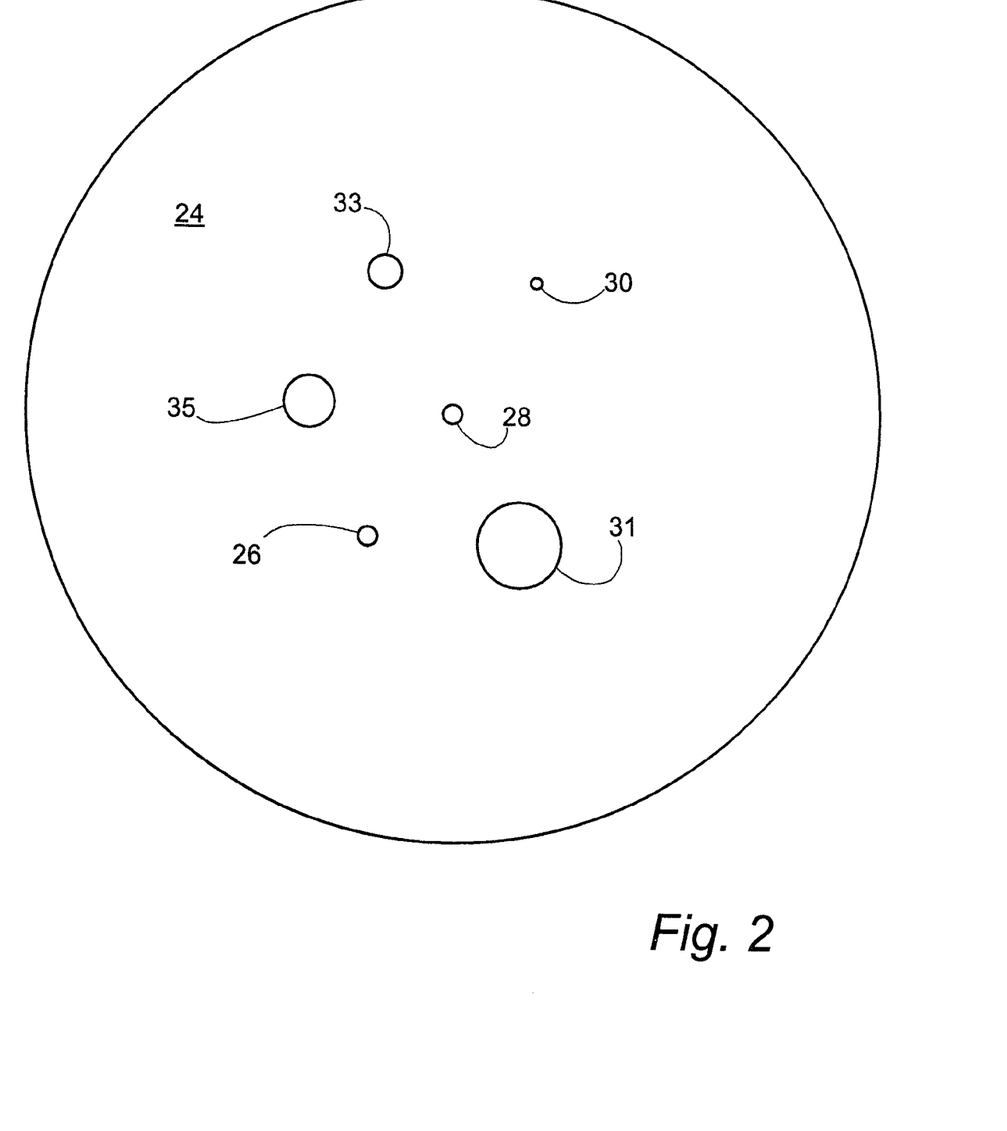
FIG. 2 is a plan view of apertured diaphragm forming part of the electron microscope.

A sample to be analysed is placed on a holder 4 within a sample chamber 5 (FIG. 2). A pump (not shown) controls the pressure of gas in the chamber. One or more further pumps and pressure limiting apertures (not shown) are provided in the electron column 1 so that the interior of the column can be maintained at a substantially total vacuum. The operation of the pump for the sample chamber, and hence the control of the gas pressure in the chamber 5 is achieved by means of a computer 8 forming part of the electron microscope.

The electron column 1 is identical to the Gemini column present in LEO 1550VP and LEO 1530VP electron microscopes (LEO is a Trade Mark). The electron column comprises an electron gun constituted by a cathode 10 and an extraction electrode 12. The cathode 10 and electrode 12 are connected to a variable voltage source 11 so that the electrode 12 is at a higher potential than the cathode 10. Positioned immediately downstream of the electrode 12 is an anode 14 which forms one end of an electron guiding tube 16. The anode 14, cathode 10 and tube 16 are connected to further voltage sources 18 and 20 which may be varied under the control of the computer 8.

The extraction electrode 12 is in the shape of a cylinder which is open at its upper end and at its lower end has a circular face with a central aperture 11.

The upper end of the tube includes a first diaphragm 22 having a single central aperture. The column also contains a further diaphragm 24 which is shown in FIG. 2, and which has multiple apertures, 26, 28, 30, 31. 33 and 35. The diaphragm 22 confines the electron beam from the gun to a size which is such that, in use, only a selected one of the apertures in the diaphragm 24 is illuminated by the beam at any one time.

The tube 16 is coaxial with a number of magnetic coils, the first of which are aperture selection and gun alignment coils, referenced 32. The coils 32 are arranged in two sets, each of four coils. The coils in each set are co-planar and the two sets of coils lie in different planes. The coils are so arranged as to be able to permit parallel displacement of the beam. Each of these coils is connected to a respective one of a number of current sources generally referenced 34 which supply currents of a value controlled by the computer 8. The coils 32 control the alignment of the electron beam onto the electron optical axis (extending through the selected aperture in the diaphragm 24).

The column is provided with a further set of aperture alignment coils 36 of a similar construction and arrangement to the coils 32. The coils 36 are situated downstream of the diaphragm 24 and operable to align the electron beam (from the selected aperture) with the central axis of the tube 16. The column also includes a set of stigmator coils 38 which correct for any distortion in the shape of beam as it passes through the column. The sets of coils 36 and 38 are also connected to the current sources 34 and therefore also receive currents of magnitudes controlled by the computer 8. Interposed between the coils 32 and 36 is a magnetic condenser lens 40. In the normal mode of operation of the device, the lens 40 is de-activated, but the device has a "high current" mode in which a current is fed to the lens 40 (when the current source is 34 under control of the computer 8) to boost the current in the electron beam.

A further coil 42 forms part of an objective lens assembly having a pole piece (not shown) similar to the pole piece 6 shown in U.S. Pat. No. 6,194,729B1. The instrument also has scanning coils 44 for scanning the electron beam over the sample. The coils 42 and 44 are also controlled by the computer 8 via the current source 34. Immediately downstream of the tube 16 is a single electrode 46 for decelerating the electron in the beam 2. The electrode 46 is generally cylindrical, having an open top and an apertured circular plate in its bottom and is maintained at a negative potential relative to the tube 16.

Figure 3:
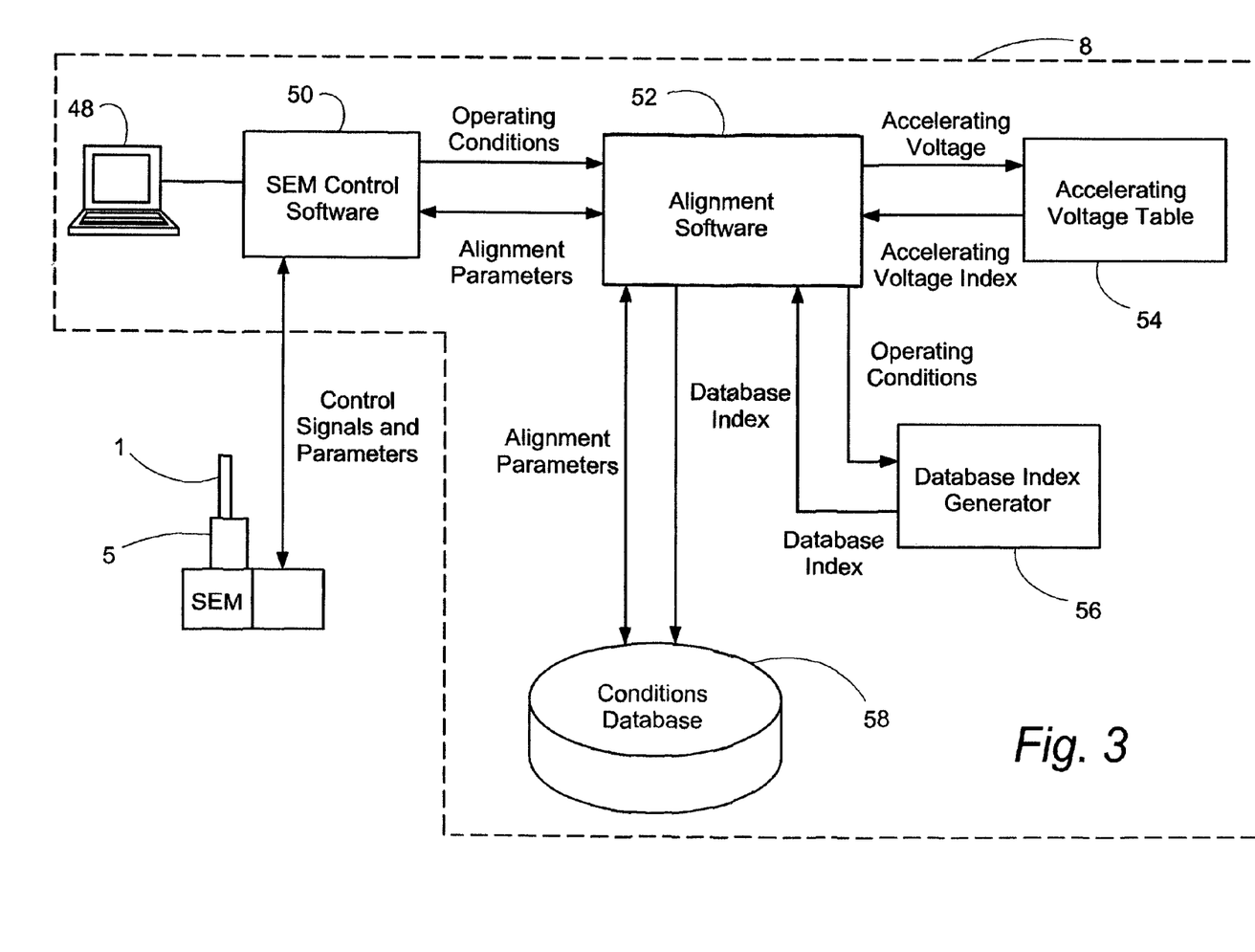
FIG. 3 is a schematic block diagram showing the software used to control the instrument in response to input from a user.

With reference to FIG. 3, the computer 8 has a terminal 48 through which a user can control the operation of the electron microscope and view images produced by the instrument. The remaining elements of the computer 8 as illustrated in FIG. 3 comprise the software used by the computer to control the various operating parameters of the electron microscope, in particular the RHT voltage supplied by the source 24 the currents supplied to the coils 32, 36, 38, 40, 42 and 44, and the pressure in the chamber 5.

The software comprises an SEM control software module 50 which provides an interface with the terminal 48. The control software 50 thus receives from the terminal 48 inputs determining the user controllable parameters which define the operating conditions. The software also retrieves alignment parameters via an alignment software module 52, the alignment parameters determining the current supplied to each of the coils 32,36,38 and 40. This information, along with the input parameters is used to control the anode voltage source 14, the current sources 34 and the pressure in the microscope chamber 5. The software module 50 and terminal 48 also constitute the tuning means via which the instrument receives signals for adjusting the selected currents fed to the coils 32,36, and/or 38.

The alignment software uses the data on the parameters defining the operating conditions to interrogate an accelerating voltage table 54 and database index generator 56 to obtain a unique index code representative of the operating conditions. This code is then used to retrieve the necessary data, i.e. values, of the operating parameters for the alignment coils 32 and 36, the stigmator coils 38 and the condenser lens 40. This data is stored in a list on a conditions database 58. The operating conditions are discussed in more detail below with reference to the worked example of the operation of the instrument, but are constituted by modes of operation, each having only two states, and a range of possible voltages to be applied to the electrode 12. The operating parameters for the alignment and stigmator coils are stored for each respective voltage in a range of possible voltages, for each given permutation of states of said modes. Thus the data contained in the database 58 can be arranged in a list having a number of portions, each of which portion corresponds to a respective permutation of operating modes. Each portion has the respective values for the parameters for the alignment and stigmator coils for each respective accelerating voltage used in the initial calibration of the instrument.

If the accelerating voltage selected by a user is not one for which there is an entry in the database 58, the alignment software performs an interpolation as described below. The alignment software 52 can also update the conditions database (by means of reverse interpolation) in the event that the user chooses to tune the alignment or stigmator coils to improve the performance of the instrument over and above that achieved with the operating parameters for the alignment and stigmator coils obtained from the alignment software 52.

The operation of the software will now be described in more detail.

The purpose of the user align software is to permit the user to store settings for the alignment and stigmator parameters that are appropriate for different operating conditions of the microscope. It achieves this by converting the current conditions of the microscope into a unique index into a database of alignment and stigmator values.

Interpolation is possible between certain values of the operating conditions to allow at least one parameter that has a continuous range to be included in the operating conditions. The table is updated with the current alignment parameters when the operating conditions are changed. Reverse interpolation is used if required.

The set of user controllable parameters that make up the column operating conditions are defined as:
  The accelerating voltage (EHT)
  The selection aperture
  High current mode (on or off)
  Variable pressure mode (high vacuum or variable pressure)
All of these parameters affect the alignment requirements for the column, and are discussed below:

Accelerating Voltage

Accelerating voltage or EHT is the energy of the primary beam of electrons. It is a continuous parameter that has a range of 0-30000 volts.

Aperture Number

The selected aperture will determine the current in the primary beam. The aperture number will be in the range 1 to 6, and this number identifies the aperture in the diaphragm 24 through which the beam is to pass.

High Current Mode

This variable is used to boost the current in the beam by activating the condenser lens 40. It is either on or off.

Variable Pressure Mode

The variable pressure mode allows a relatively high chamber pressure to be used by using additional apertures and pumps (not shown). The additional apertures alter the alignment properties of the column since the liner tube 16 is switched off to suppress the strong electric field that would otherwise exist in a poor vacuum. Variable pressure mode is either on or off.

Alignment Parameters

The following parameters constitute the dataset that defines the alignment of the electron beam, and are the 'further parameter' referred to in the Summary of the Invention.

Gun Align X and Y

These parameters control the alignment of the beam onto the electron optical axis through the selected aperture in the diaphragm 24. They determine the currents in the gun align coils.

Aperture Align X and Y

These parameters control the deflection of the beam having passed through one of the apertures in the multi hole aperture holder. They determine the currents in the aperture align coils.

Stigmator X and Y

Stigmator parameters are used to correct for any distortion in the shape of the beam as it passes through the column. The values are used to determine the currents in the stigmator coils. The values are expressed as percentages of the full scale deflection currents of the coils.

In a modified version of the invention, the database 58 also includes stigmator calibration on values, a set of four values that can be used to adjust the relative current in the stigmator coils to eliminate beam shift while adjusting the stigmator values.

The value in the field identifier determines the operating conditions the table entry in the database 58 applies to the index code, identifying the relevant entry is constituted in the way shown in the first table below, by the index generator 56.

Each parameter is converted to a binary number and is allocated a number of bits in an index value according to the maximum range of that parameter. The accelerating voltage is converted into an index according to the second table below, the table being started at 56. For any given voltage there will either be an exact match, or two entries one above and one below.

Index code:

| HC Mode | VP Mode | Aperture Number | EHT Index | | | | |
|---|---|---|---|---|---|---|---|
| | | | | | | | |

The EHT Index is defined as:

| Index | Voltage |
|---|---|
| 0 | 100 V |
| 1 | 200 V |
| 2 | 500 V |
| 3 | 1 kV |
| 4 | 2 kV |
| 5 | 5 kV |
| 6 | 10 kV |
| 7 | 19.999 kV |
| 8 | 20 kV |
| 9 | 30 kV |

This means for any given operating conditions there will either be a single unique index entry in the database 58, or there will be two values one at the accelerating voltage above actual value and one below.

These indexes can be used to search the database to retrieve a relevant set of alignment parameters. The database provides a user align look-up table, a segment of which is as follows:

User Align Look-up Table

| Index | Gun Align X | Gun Align Y | Aperture Align X | Aperture Align Y | Stigmator X | Stigmator Y |
|---|---|---|---|---|---|---|
| 336 | 6.5% | 6.6% | 6.4% | −9.7% | 0.5% | −1.3% |
| 337 | 5.1% | 8.5% | 6.8% | −10.4% | 0.7% | −1.2% |
| 338 | 4.9% | 2.4% | 5.9% | −11.4% | 1.2% | −1.0% |
| 339 | 6.7% | 0.3% | 2.1% | −10.5% | 1.1% | −0.8% |
| 340 | 8.4% | −3.6% | −0.7% | −9.2% | 0.9% | −0.7% |
| 341 | 10.0% | −7.8% | −1.5% | −8.4% | 0.7% | −0.8% |
| 342 | 15.0% | −12.2% | −3.2% | −7.9% | 0.8% | −1.1% |
| 343 | 17.3% | −10.6% | −5.7% | −7.5% | 1.1% | −1.2% |

It should be noted that the alignment and stigmator values are shown rounded to 1 decimal clarity. They are stored to a greater precision than is shown. If required other parameters could be added to the table.

Interpolation

In the case where the accelerating voltage is not an exact match with an index table entry, it is possible to perform linear interpolation to find the right setting x(u) for each parameter.

$$x(u) = \frac{(u_{i+1} - u)x_i + (u - u_i)x_{i+i}}{u_{i+1} - u_i} \text{ where } u_i < u < u_{i+1}$$

Using the Database

To maintain alignment while operating the microscope the following procedure is used.

1. On selection of a new set of operating conditions the database is queried to see if a set of alignment parameters are stored for the new conditions.
2. If these are found, then the alignment parameters are adjusted on the microscope (using interpolation if necessary) to match the stored values
3. The user is then freely able to adjust the alignment parameters.
4. When the operating conditions next change, the database can be updated (either automatically or after prompting the user) with the current values of the alignment parameters.

Reverse Interpolation

In the simple case where there is an exact match in accelerating voltage with the table, the database can be updated directly from the alignment parameters.

When interpolation has been used, it is necessary to use reverse interpolation to update the two adjacent database entries proportionately using reverse interpolation, if the parameters retrieved by the alignment software 52 are tuned. The database valves $x_{i+1}$ and $x_i$ are updated with the following equations.

and $$x_i = x_i + (x'(u) - x(u))\frac{(u_{i+1} - u)(u_{i+1} - u_i)}{(u_{i-1} - u)^2 + (u - u_i)^2}$$

where x'(u) is the current value of the parameter in question.

Worked Example

In the case of operating in high current mode, but not in VP mode and selecting aperture number 5 at a voltage of 6 kV, there will be two database indexes that are relevant, one for the table entry below 6 kV and one for the entry above it.

| HC Mode | VP Mode | Aperture Number | | | EHT Index | | | |
|---|---|---|---|---|---|---|---|---|
| 1 | 0 | 1 | 0 | 1 | 0 | 1 | 0 | 1 |

This equates to a decimal index value of 341

| HC Mode | VP Mode | Aperture Number | | | | EHT Index | | |
|---|---|---|---|---|---|---|---|---|
| 1 | 0 | 1 | 0 | 1 | 0 | 1 | 1 | 0 |

This equates to a decimal index value of 342.

Now supposing the gun align X values read out of these indexes are 10% and 15% respectively, then applying the equation given earlier results in a new value of 11%.

$$11\% = ((10000-6000)*10\% + (6000-5000)*15\%) / (10000-5000)$$

Similarly if that parameter is adjusted by the user to 13%, then the new values for the database table entries are calculated as:

$$15.558\% = 15\% + (13\% - 11\%)*(6000-5000)*(10000-5000)/((10000-6000)^2 + (6000-5000)^2)$$

$$12.353\% = 10\% + (13\% - 11\%)(10000-6000)(10000-5000)/((10000-6000)^2 + (6000-5000)^2)$$

Thus the database is modified in line with the latest values set by the user.

The invention claimed is:

1. An instrument having:
   a) a user controllable operating parameter having a number of possible user controllable parameter values;
   b) a further operating parameter which is at least partially dependent on the user controllable parameter and which has any of a number of possible further parameter values, each corresponding to a respective one of the user controllable parameter values;
   c) a memory for storing the possible further parameter values;
   d) a selector for selecting one of the further stored parameter values for the further operating parameter in response to the selection by the user of the associated user controllable parameter value and for controlling the instrument accordingly;
   e) whereby, if the selected user controllable parameter value is one for which there is no associated further parameter value stored in the memory, the instrument is operable to interpolate between further parameter values, stored in the memory, which correspond to user controllable parameter values in closest proximity to the selected user controllable parameter value to obtain a further parameter value corresponding to said selected user controllable parameter value;
   f) a tuner for enabling a user to adjust the selected further parameter value, after a given user controllable parameter value has been selected, to obtain an adjusted further parameter value;
   g) updating apparatus for updating the memory so that the adjusted further parameter value is selected if the given user controllable parameter value is again selected for the user controllable operating parameter.

2. An instrument according to claim 1, in which the updating apparatus is such that if the selected, interpolated further parameter value is adjusted, the updating apparatus is operable to update each of said two values in the memory so that said interpolation would have yielded the adjusted value in response to the selection of the same intermediate value of user controllable parameter had this occurred after said updating.

3. An instrument according to claim 2, in which if the selected, interpolated further parameter is updated, only said two values in the memory are updated.

4. An instrument according to claim 1, in which the stored values of the further parameter are arranged in the memory in an index in which the stored values are arranged in an order corresponding to progressively changing values of the associated user controlled parameter.

5. An instrument according to claim 1, in which the further operating parameter is one of a plurality of such parameters, values for all of which are stored in the memory.

6. An instrument according to claim 1, in which the instrument is a charged particle beam instrument having a beam generator for generating charged particles and for subjecting said particles to an accelerating voltage to create a beam, and an alignment element for controlling the alignment of the beam, wherein said accelerating voltage constitutes the user controllable parameter and the further operating parameter comprises a setting for the alignment element.

7. An instrument according to claim 6, in which the alignment element is a magnetic coil, and the associated further parameter is the value or relative value of current passed through the coil.

8. An instrument according to claim 6, in which the alignment element is an electrode the value of the associated parameter being the voltage applied to the electrode.

9. An instrument according to claim 6, in which the instrument has a plurality of different alignment coils, the further operating parameter is one of a plurality of such parameters, values for all of which are stored in the memory, and the further operating parameters comprise the currents in the coils or the relative current magnitudes in the coils.

10. An instrument according to claim 6, in which the charged particle beam instrument is a scanning electron microscope, the beam generator comprising an electron gun having a cathode and an extraction electrode to which said accelerating voltage is applied, the alignment coils acting as gun alignment coils for controlling the alignment of the beam onto an electron optical axis of the microscope.

11. An instrument according to claim 10, in which the electron microscope includes a plurality of apertures in the path of a beam to be generated by the beam generator, wherein the alignment coils are operable to direct the beam through any selected one of the apertures.

12. An instrument according to claim 11, in which the magnitude of the accelerating voltage comprises one of a plurality of user controllable parameters, another such parameter being constituted by the identity of the aperture through which the beam is to pass.

13. An instrument according to claim 12, in which the stored values are arranged in a list in which each said value is identified by a respective index code representative of the combination of accelerating voltage and aperture identity for which the stored value of alignment coil current or relative current at that entry applies.

14. An instrument according to claim 13, wherein the list is pad of a look-up table in which, for each index code, there are also stored values for additional further parameters applicable to the respective combination of aperture identity and accelerating voltage.

15. An instrument according to claim 14, in which the instrument includes stigmator coils for correcting the distortion of the electron beam, the current for each such coil constituting a respective additional further parameter.

16. An instrument according to claim 13, in which the instrument has a number of operating modes, each of which constitutes a user controllable parameter, the index code also being representative of the state of at least one of the operating modes.

17. An instrument according to claim 1, wherein the instrument is a scanning charged particle beam instrument having a gun for generating the beam of charged particles, a plurality of apertures through any selected one of which the beam may pass, an accelerating electrode to which a voltage is applied to accelerate the particles away from the gun, and at least one alignment element for directing the beam through the selected aperture, wherein the further parameter values which are stored in a memory comprise values for the settings of the alignment element dependent on the voltage applied to the accelerating electrode and the choice of aperture.

18. An instrument having:
a) a user controllable operating parameter having a number of possible user controllable parameter values;
b) a further operating parameter which is at least partially dependent on the user controllable parameter and which has any of a number of possible further parameter values, each corresponding to a respective one of the user controllable parameter values;
c) a memory for storing the possible further parameter values;
d) a selector for selecting one of the further stored parameter values for the further operating parameter in response to the selection by the user of the associated user controllable parameter value and for controlling the instrument accordingly;
e) wherein the stored further parameter values are arranged in the memory in an index in which the stored values are arranged in an order corresponding to progressively changing values of the associated user controllable operating parameter;
(f) a tuner for enabling a user to adjust the selected further parameter value, after a given user controllable parameter value has been selected, to obtain an adjusted further parameter value; and
(g) updating apparatus for updating the memory so that the adjusted further parameter value is selected if the given user controllable parameter value is again selected for the user controllable operating parameter.

19. An instrument according to claim 18, in which the instrument is a charged particle beam instrument having a beam generator for generating charged particles and for subjecting said particles to an accelerating voltage to create a beam, and an alignment element for controlling the alignment of the beam, wherein said accelerating voltage constitutes the user controllable parameter and the further operating parameter comprises a selling for the alignment element.

20. An instrument according to claim 19 in which the charged particle beam instrument is a scanning electron microscope, the beam generator, comprising an electron gun having a cathode and an extraction electrode to which said accelerating voltage is applied, the alignment coils acting as gun alignment coils for controlling the alignment of the beam onto an electron optical axis of the microscope.

21. An instrument according to claim 20, in which the electron microscope includes a plurality of apertures in the path of a beam to be generated by the beam generator, wherein the alignment coils are operable to direct the beam through any selected one of the apertures.

22. An instrument according to claim 21, in which the magnitude of the accelerating voltage comprises one of a plurality of user controllable parameters, another such parameter being constituted by the identity of the aperture through which the beam is to pass.

23. An instrument according to claim 22, in which the stored values are arranged in a list in which each said value is identified by a respective index code representative of the combination of accelerating voltage and aperture identity for which the stored value of alignment coil current or relative current at that entry applies.

24. An instrument according to claim 23, in which the list is part of a look-up table, for each index code, there are also stored values for additional parameters applicable to the respective combination of aperture identity and accelerating voltage.

25. An instrument according to claim 24, in which the instrument includes stigmator coils for correcting the distortion of the electron beam the current for each such coil constituting a respective additional further parameter.

26. An instrument having:
a) a user controllable operating parameter having a number of possible user controllable parameter values;
b) a further operating parameter which is at least partially dependent on the user controllable parameter and which has any of a number of possible further parameter values, each corresponding to a respective one of the user controllable parameter values;
c) a memory for storing the possible further parameter values;
d) a selector for selecting one of the further stored parameter values for the further operating parameter in response to the selection by the user of the associated user controllable parameter value and for controlling the instrument accordingly;
e) wherein the instrument is a charged particle beam instrument having a beam generator for generating charged particles and for subjecting said particles to an accelerating voltage to create a beam, alignment coils for controlling the alignment of the beam and a plurality of apertures, the alignment coils being operable to direct the beam through any selected one of the apertures the beam being directed through only one aperture at any one time, wherein said accelerating voltage and identity of aperture through which the beam is to pass are user controllable operating parameters and the further operating parameter comprises a current selling for the alignment coils, and wherein the stored further parameter values are arranged in a list in which each said further parameter value is identified by a respective index code representative of the combination of accelerating voltage and aperture identity to which the further parameter value applies;
f) a tuner for enabling a user to adjust the selected further parameter value, after a given user controllable parameter value has been selected, to obtain an adjusted further parameter value;
(g) updating apparatus for updating the memory so that the adjusted further parameter value is selected if the given user controllable parameter value is again selected for the user controllable operating parameter.

27. An instrument according to claim 26 wherein the list is part of a look-up table in which, for each index code, there are also stored values for additional parameters applicable to the respective combination of aperture identity in accelerating voltage.

28. An instrument according to claim 27, in which the instrument includes stigmator coils for correcting the distortion of the electron beam, the current for each such coil constituting a respective additional further parameter.

29. An instrument having:
a) a user controllable operating parameter having a number of possible user controllable parameter values;
b) a further operating parameter which is at least partially dependent on the user controllable parameter and which has any of a number of possible further parameter values, each corresponding to a respective one of the user controllable parameter values;
c) a memory for storing the possible further parameter values;
d) a selector for selecting one of the further stored parameter values for the further parameter in response to the selection by the user of the associated user controllable parameter value and for controlling the instrument accordingly;
e) wherein the instrument is an electron microscope comprising an electron gun having a cathode and an extraction electrode to which an accelerating voltage is applied to create a beam, and gun alignment coils for controlling the alignment of the beam onto an electron optical axis of the microscope wherein said accelerating voltage constitutes the user controllable operating parameter and the further operating parameter comprises a selling for the gun alignment coils, and wherein the microscope has a number of operating modes, each of which also constitutes a user controllable operating parameter, an index code in the memory also being representative of the state of at least one of the operating modes;
f) a tuner for enabling a user to adjust the selected further parameter value, after a given user controllable parameter value has been selected, to obtain an adjusted further parameter value;
g) updating apparatus for updating the memory so that the adjusted further parameter value is selected if the given user controllable parameter value is again selected for the user controllable parameter.

30. An instrument according to claim 29, in which the electron microscope includes a plurality of apertures in the path of a beam to be generated by the beam generator, wherein the alignment coils are operable to direct the beam through any selected one of the apertures.

31. An instrument according to claim 30, in which the magnitude of the accelerating voltage comprises one of a plurality of user controllable parameters, another such parameter being constituted by the identity of the aperture through which the beam is to pass.

32. An instrument according to claim 31, in which the stored values are arranged in a list in which each said value is identified by a respective index code representative of the combination of accelerating voltage and aperture identity for which the stored value of alignment coil current or relative current at that entry applies.

33. An instrument according to claim 32, in which the list is part of a look-up table, for each index code, there are also stored values for additional parameters applicable to the respective combination of aperture identity in accelerating voltage.

34. An instrument according to claim 33, in which the instrument includes stigmator coils for correcting the distortion of the electron beam, the current for each such coil constituting a respective additional further parameter.

\* \* \* \* \*